United States Patent
Yamagiwa et al.

(10) Patent No.: US 12,439,661 B2
(45) Date of Patent: Oct. 7, 2025

(54) SEMICONDUCTOR DEVICE

(71) Applicant: Panasonic Intellectual Property Management Co., Ltd., Osaka (JP)

(72) Inventors: Hiroto Yamagiwa, Hyogo (JP); Manabu Yanagihara, Osaka (JP); Takahiro Sato, Toyama (JP); Masahiro Hikita, Hyogo (JP); Hiroaki Ueno, Osaka (JP); Yusuke Kinoshita, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 625 days.

(21) Appl. No.: 17/637,352

(22) PCT Filed: Aug. 21, 2020

(86) PCT No.: PCT/JP2020/031634
§ 371 (c)(1),
(2) Date: Feb. 22, 2022

(87) PCT Pub. No.: WO2021/039631
PCT Pub. Date: Mar. 4, 2021

(65) Prior Publication Data
US 2022/0302259 A1 Sep. 22, 2022

Related U.S. Application Data

(60) Provisional application No. 63/229,207, filed on Aug. 4, 2021.

(30) Foreign Application Priority Data
Aug. 30, 2019 (JP) .................. 2019-157572

(51) Int. Cl.
H10D 62/13 (2025.01)
H10D 30/47 (2025.01)
(Continued)

(52) U.S. Cl.
CPC ....... H10D 62/151 (2025.01); H10D 30/4755 (2025.01); H10D 62/378 (2025.01); H10D 62/8503 (2025.01)

(58) Field of Classification Search
CPC ............ H01L 29/0847; H01L 29/2003; H01L 29/7787
See application file for complete search history.

(56) References Cited

U.S. PATENT DOCUMENTS 9,391,142 B2 * 7/2016 Saito ................... H10D 30/475
2005/0189561 A1 9/2005 Kinzer et al.
(Continued)

FOREIGN PATENT DOCUMENTS

JP 2007-526633 A 9/2007
JP 2008-098434 A 4/2008
(Continued)

OTHER PUBLICATIONS

International Search Report issued on Nov. 10, 2020 in International Patent Application No. PCTJP2020/031634, with English translation.
(Continued)

Primary Examiner — Jay C Kim
Assistant Examiner — Woo K Lee
(74) Attorney, Agent, or Firm — Rimon P.C.

(57) ABSTRACT

A semiconductor device includes: a substrate; a first nitride semiconductor layer above the substrate; a second nitride semiconductor layer above the first nitride semiconductor layer and being greater than the first nitride semiconductor layer in band gap; and a first field-effect transistor including
(Continued)

a first source electrode, a first drain electrode, and a first gate electrode that are above the second nitride semiconductor layer, the first source electrode and the first drain electrode being separated from each other, the first gate electrode being disposed between the first source electrode and the first drain electrode. The first field-effect transistor includes a third semiconductor layer that is above the second nitride semiconductor layer in part of a region between lower part of the first source electrode and the first gate electrode, and is separated from the first gate electrode. The third semiconductor layer and the first source electrode are electrically connected.

13 Claims, 22 Drawing Sheets

(51) Int. Cl.
  H10D 62/17 (2025.01)
  H10D 62/85 (2025.01)

(56) References Cited

U.S. PATENT DOCUMENTS

| 2008/0087915 A1* | 4/2008 | Uemoto | H01L 29/1066 257/E29.252 |
| 2011/0215379 A1 | 9/2011 | Koshi et al. | |
| 2012/0146093 A1 | 6/2012 | Shibata et al. | |
| 2015/0263104 A1 | 9/2015 | Saito et al. | |
| 2016/0035853 A1 | 2/2016 | Kaneko et al. | |
| 2016/0043643 A1 | 2/2016 | Ujita et al. | |
| 2021/0408273 A1* | 12/2021 | Wu | H10D 30/475 |

FOREIGN PATENT DOCUMENTS

| JP | 2011-054845 A | 3/2011 |
| JP | 2011-181743 A | 9/2011 |
| JP | 2013-038250 A | 2/2013 |
| JP | 2013-125918 A | 6/2013 |
| JP | 2015-173151 A | 10/2015 |
| JP | 2016-031997 A | 3/2016 |
| WO | 2014/174810 A1 | 10/2014 |
| WO | 2014/188651 A1 | 11/2014 |

OTHER PUBLICATIONS

Japanese Office Action dated Oct. 1, 2024 issued in the corresponding Japanese Patent Application No. 2021-542839.

* cited by examiner

SEMICONDUCTOR DEVICE

CROSS-REFERENCE OF RELATED APPLICATIONS

This application is the U.S. National Phase under 35 U.S.C. § 371 of International Patent Application No. PCT/JP2020/031634, filed on Aug. 21, 2020, which in turn claims the benefit of Japanese Application No. 2019-157572, filed on Aug. 30, 2019, the entire disclosures of which applications are incorporated by reference herein.

TECHNICAL FIELD

The present invention relates to a semiconductor device including a nitride semiconductor layer, and, in particular, to a semiconductor device for use in a switched-mode power supply circuit, inverter, and the like.

BACKGROUND ART

A III-V nitride compound semiconductor or what is called a nitride semiconductor, typically gallium nitride (GaN), is a compound semiconductor represented as $In_xGa_yAl_{1-x-y}N$ (0≤x≤1, 0≤y≤1, x+y≤1) in a general formula and made of aluminum (Al), gallium (Ga), and indium (In) in group III elements and nitrogen (N) in group V elements.

The nitride semiconductor can form various mixed crystals and makes it possible to form heterojunction interfaces easily. The heterojunctions of the nitride semiconductor are characterized by a highly concentrated two-dimensional electron gas layer (2DEG layer) being generated in a junction interface thereof due to spontaneous polarization and piezoelectric polarization in the interface. A field-effect transistor (FET) in which such a highly concentrated 2DEG layer is used as a carrier has been drawing attention for high frequency and high power devices.

It has been known that a nitride semiconductor FET is prone to a phenomenon called current collapse. The current collapse refers to a phenomenon that the ON resistance of the FET increases when the device is placed into an OFF state and then returned to an ON state because electrons are trapped in the nitride semiconductor and therefore a 2DEG layer, which is a carrier, is constricted. Poor tolerance to the current collapse leads to an increase in conduction loss due to the ON resistance and causing a serious problem with operation of a switched-mode power supply and an inverter.

To reduce the current collapse, there is a structure in which a fourth electrode of a P-type semiconductor is connected to a drain electrode to allow electrons trapped in the nitride semiconductor to be recombined by a hole current in the OFF state in which a drain voltage increases to a high voltage (see Patent Literature (PTL) 1, PTL 2).

Further, as a typical circuit configuration for a switched-mode power supply or an inverter, which includes nitride semiconductor FETs, there is a half bridge in which an FET is used for each of a high side and a low side. Further, there are a full bridge formed from 2 half bridges and a 3-phase inverter formed from 3 half bridges. In the half bridge, the FET on the high side and the FET on the low side are alternately switched on and off for power conversion from an input to an output.

CITATION LIST

Patent Literature

[PTL 1] Japanese Unexamined Patent Application Publication No. 2011-181743
[PTL 2] WO 2014/174810

SUMMARY OF INVENTION

Technical Problem

FIG. 9 illustrates a sectional view of a nitride semiconductor FET of prior art. In such a nitride semiconductor FET of prior art, it is a common practice to connect a potential of substrate 901 to source electrode 912 at which the potential decreases to a low potential.

Since nitride semiconductor FETs have a lateral structure in which all electrodes of source electrode, drain electrode, and gate electrode are on a nitride semiconductor surface, high side and low side FETs can be integrated in a single semiconductor chip to form a half bridge. FIG. 10 illustrates a half bridge structure of prior art in which first FET 91 on the high side and second FET 92 on the low side that include a nitride semiconductor are integrated. In such a half bridge structure, substrate 901 is connected to source electrode 922 of second FET 92 at which the potential is stable to suppress noise generation from substrate 901 during switching.

A problem with a nitride semiconductor half bridge of prior art is that, when the first FET on the high side and the second FET on the low side are switched, current collapse may occur in the first FET on the high side. FIG. 11A illustrates waveforms of drain-source voltage Vds and drain current Ids when the second FET on the low side is switched, in prior art, and FIG. 11B illustrates waveforms of drain-source voltage Vds and drain current Ids when the first FET on the high side is switched, in prior art. In the first FET, the drain-source voltage Vds increases as much as 50 V due to the current collapse. As described above, a problem with prior art is that the conduction loss of the first FET increases and a channel temperature of the first FET on the high side is likely to exceed the absolute maximum temperature ratings.

Accordingly, an object of the present disclosure is to provide a semiconductor device with occurrence of current collapse being suppressed in a half bridge structure in which nitride semiconductor FETs are integrated.

Solution to Problem

To attain the object, in a semiconductor device according to an aspect of the present disclosure, a third semiconductor layer is disposed in a part of a region between a lower part of a source electrode and a gate electrode of an FET and separated from the gate electrode.

Advantageous Effects of Invention

In a semiconductor device according to an aspect of the present disclosure, an effect of suppressing occurrence of current collapse is produced by recombining electrons trapped in a nitride semiconductor layer in the lower part of the source electrode of the FET with hole currents injected from the third semiconductor layer disposed in the lower part of the source electrode.

DESCRIPTION OF EMBODIMENTS

Embodiments of the present disclosure will now be described in detail with reference to drawings. Like components are given reference signs with the same numerals in part except alphabets, and duplicate description will not be repeated. Note that the term "above" is applied not only when two elements are disposed apart from each other and there is one or more elements between the two elements, but also when two elements are disposed in contact with each other.

Embodiment 1

Figure 1A:
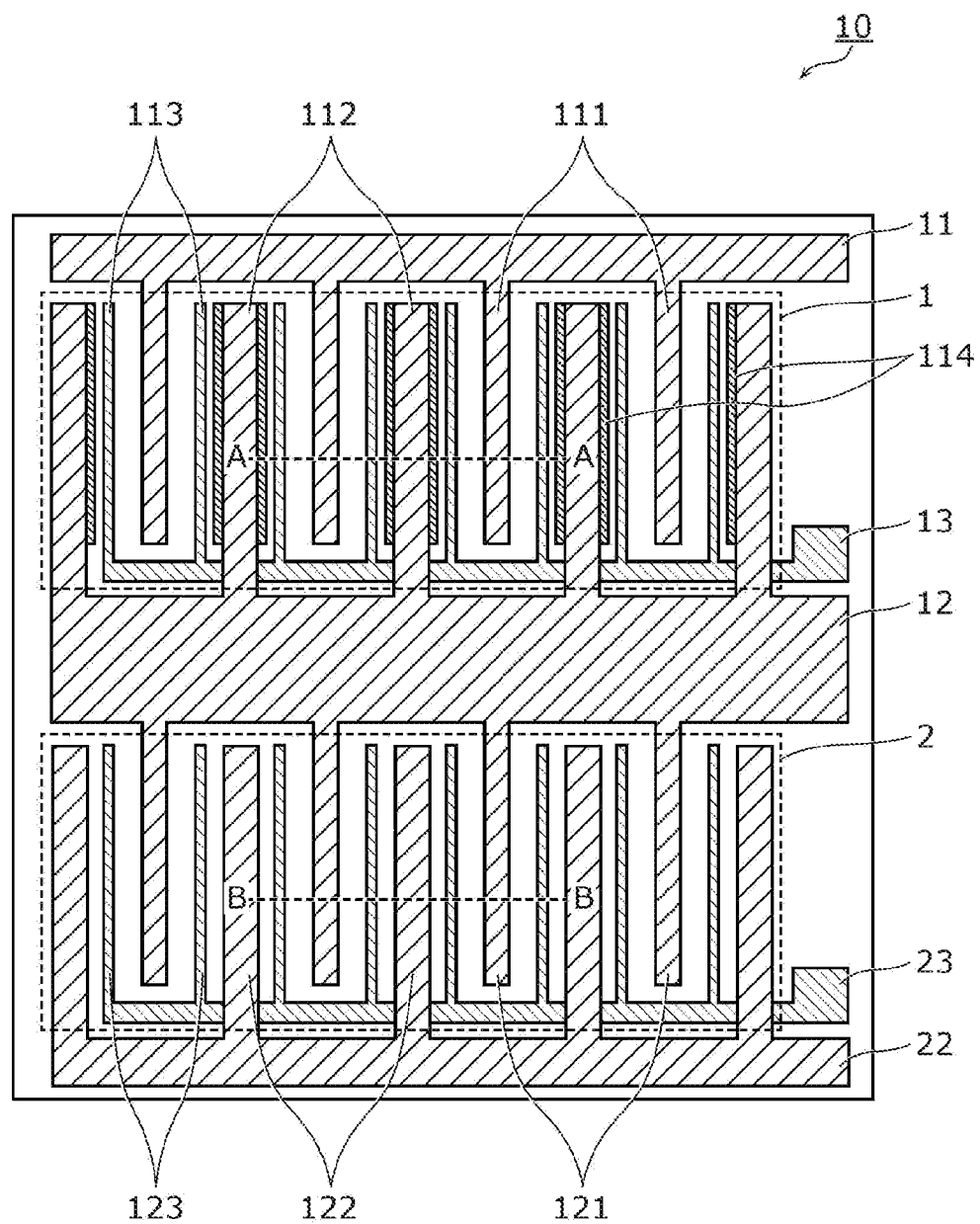
FIG. 1A is a plan view of a semiconductor device according to Embodiment 1.

FIG. 1A illustrates a plan view of semiconductor device 10 according to Embodiment 1 of the present disclosure. First FET 1 (first field-effect transistor 1) formed from first drain electrode 111, first source electrode 112, and first gate electrode 113, and second FET 2 (second field-effect transistor 2) formed from second drain electrode 121, second source electrode 122, and second gate electrode 123 are integrated on the same substrate.

Figure 1B:
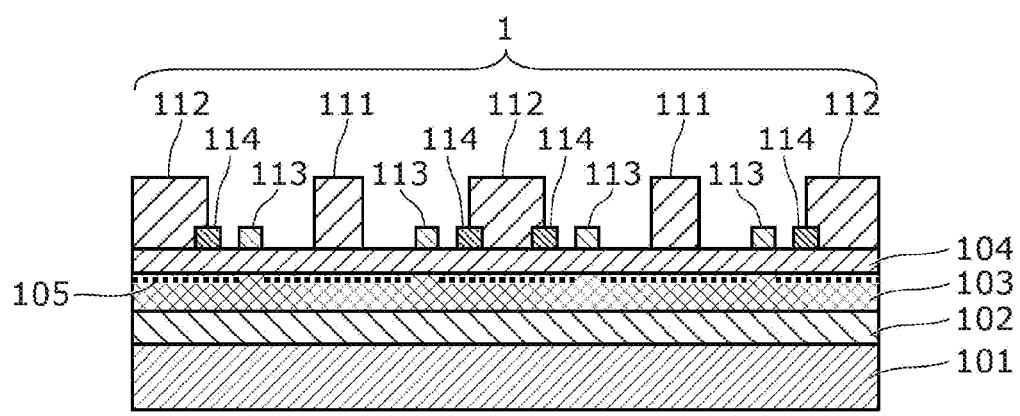
FIG. 1B is a sectional view of the semiconductor device according to Embodiment 1 along a line A-A.
Figure 1C:
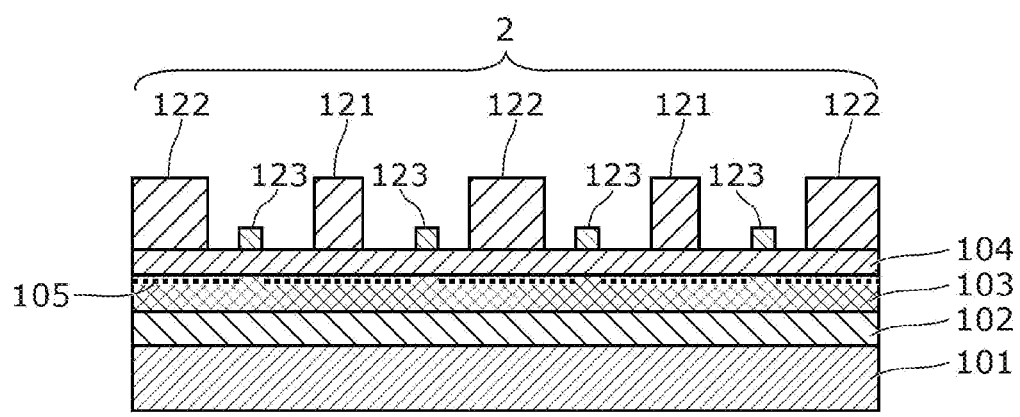
FIG. 1C is a sectional view of the semiconductor device according to Embodiment 1 along a line B-B.

FIG. 1B illustrates a sectional view along a line A-A in FIG. 1A. FIG. 1C illustrates a sectional view along a line B-B in FIG. 1A. Buffer layer 102, GaN channel layer 103 (first nitride semiconductor layer 103), and AlGaN barrier layer 104 (second nitride semiconductor layer 104) having a band gap greater than a band gap of GaN channel layer 103 are disposed in this order above substrate 101 made of Si. Here, buffer layer 102 is formed in a multilayer structure of, for example, AlN and AlGaN, and has a total film thickness of, for example, about 2.1 µm. GaN channel layer 103 is made of, for example, undoped GaN and has a layer thickness of, for example, about 1.6 µm. AlGaN barrier layer 104 is composed of, for example, $Al_{0.17}Ga_{0.83}N$, and has a layer thickness of, for example, about 60 nm. Highly concentrated 2DEG layer 105 is formed at an interface between GaN channel layer 103 and AlGaN barrier layer 104 due to the effect of piezoelectric polarization and spontaneous polarization.

First drain electrode 111, first source electrode 112, and first gate electrode 113 that form first FET 1 and second drain electrode 121, second source electrode 122, and second gate electrode 123 that form second FET 2 are disposed above AlGaN barrier layer 104. Each of first drain electrode 111, first source electrode 112, second drain electrode 121, and second source electrode 122 is a laminate of, for example, titanium (Ti) and aluminum (Al) and in ohmic contact with 2DEG layer 105. Each of first gate electrode 113 and second gate electrode 123 is a laminate of, for example, nickel (Ni) and gold (Au) and in schottky contact with AlGaN barrier layer 104. First gate electrode 113 and second gate electrode 123 may be formed from a P-type semiconductor.

First drain electrodes 111 are each connected to first drain aggregated line 11. First gate electrodes 113 are each connected to first gate aggregated line 13. Second source electrodes 122 are each connected to second source aggregated line 22. Second gate electrodes 123 are each connected to second gate aggregated line 23. First source electrodes 112 and second drain electrodes 121 are each connected to intermediate aggregated line 12.

Figure 1D:
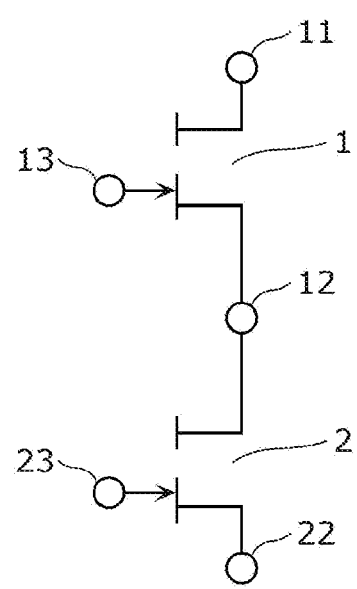
FIG. 1D is a diagram illustrating an equivalent circuit of the semiconductor device according to Embodiment 1.

FIG. 1D illustrates an equivalent circuit of semiconductor device 10 according to Embodiment 1. Semiconductor device 10 according to Embodiment 1 is a half bridge, and first FET 1 is on the high side and second FET 2 is on the low side.

Although not explicitly illustrated in FIG. 1C, when a half bridge is formed from first FET 1 on the high side and second FET 2 on the low side, substrate 101 is allowed to float or electrically connected to second source electrode 122. When substrate 101 is electrically connected to second source electrode 122, second source electrode 122 is generally fixed to a stable potential of low voltage. Accordingly, voltage variation of substrate 101 is eliminated so that noise generation can be suppressed by connecting substrate 101 to second source electrode 122.

As illustrated in FIG. 1B, in first FET 1, third semiconductor layer 114 is selectively disposed above AlGaN barrier layer 104 between a lower part of first source electrode 112 and first gate electrode 113, third semiconductor layer 114 being separated from first gate electrode 113. Third semiconductor layer 114 is disposed in electrical contact with first source electrode 112 and embedded in a part of first source electrode 112. Preferably, third semiconductor layer 114 is made of, for example, GaN, and is a P-type semiconductor.

Figure 2A:
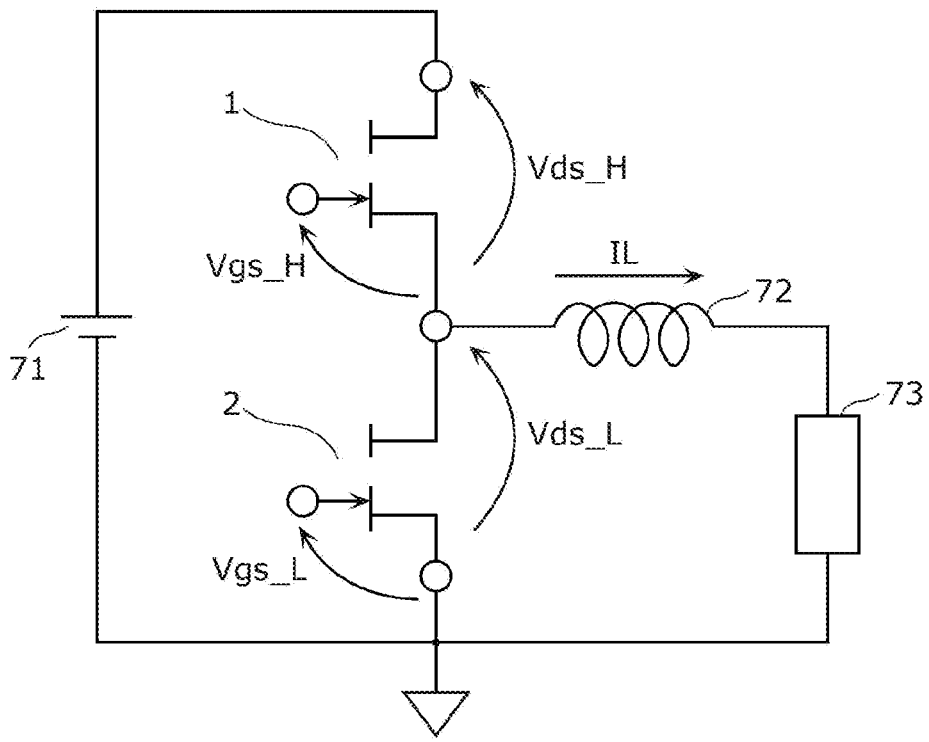
FIG. 2A is a diagram illustrating a switching circuit according to Embodiment 1.

The operation of semiconductor device 10 according to Embodiment 1 will now be described. FIG. 2A is a representative example of a switching circuit with a half bridge. First FET 1 on the high side and second FET 2 on the low side, which constitute the half bridge, are connected across high-voltage power supply 71. One end of inductor 72 is connected to a middle point of the half bridge and load 73 is connected to the other end of inductor 72.

Figure 2B:
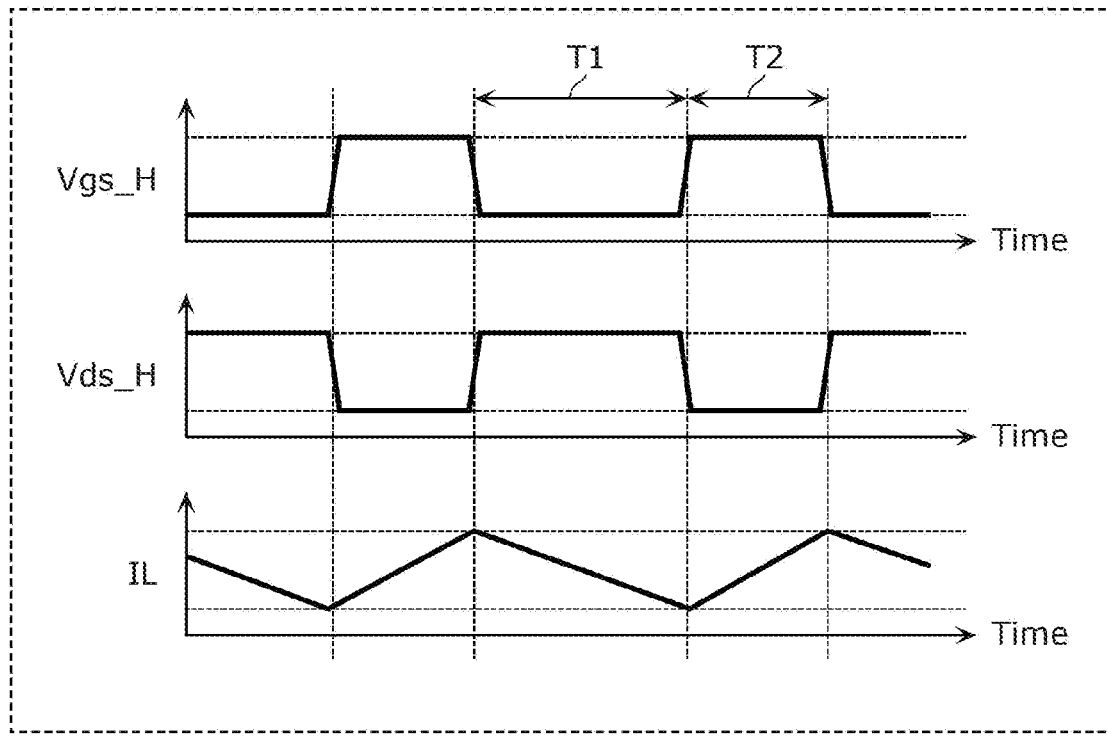
FIG. 2B illustrates switching waveforms according to Embodiment 1.

FIG. 2B illustrates operation waveforms of the switching circuit in FIG. 2A. During period T1 in which gate-source voltage Vgs_H of first FET 1 assumes a voltage less than or equal to a threshold voltage, first FET 1 is in an OFF state, and drain-source voltage Vds_H of first FET 1 is equal to the voltage of high-voltage power supply 71. The voltage of high-voltage power supply 71 is, for example, about 400 V.

During a period T2 in which gate-source voltage Vgs_H of first FET 1 assumes a voltage greater than or equal to a threshold voltage, first FET 1 is in an ON state, and a current flows in load 73 through a drain and a source. Drain-source voltage Vds_H of first FET 1 equals load current IL×ON resistance Rdson, and when, for example, IL=10 A and Rdson=100 mΩ, Vds_H=1 V.

Figure 2C:
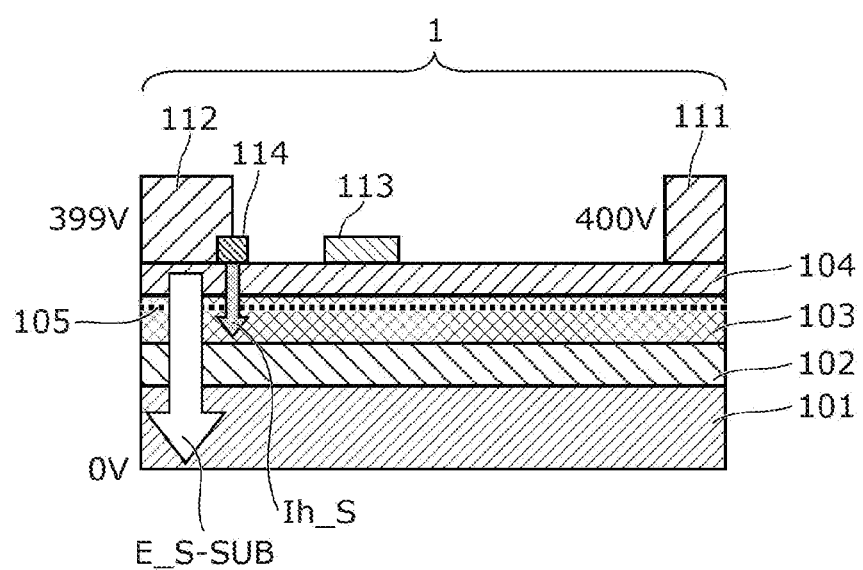
FIG. 2C is a diagram illustrating an operation of a FET in an ON state according to Embodiment 1.

FIG. 2C illustrates the operation of first FET 1 when first FET 1 is in an ON state. The voltage of first drain electrode 111 is fixed to 400 V and the voltage of substrate 101 is fixed to 0 V. Since first FET 1 is in the ON state, drain-source voltage Vds_H is about 1 V. Consequently, the voltage of first source electrode 112 is about 399 V. Here, downward electric field E_S-SUB is applied between first source electrode 112 and substrate 101. Electric field E_S-SUB causes electrons to be trapped in buffer layer 102, GaN channel layer 103, and AlGaN barrier layer 104 near first source electrode 112.

In semiconductor device 10 according to Embodiment 1 of the present disclosure, third semiconductor layer 114 of a P-type semiconductor is disposed on a surface of AlGaN barrier layer 104 between a lower part of first source electrode 112 and first gate electrode 113, and hole current Ih_S flows from third semiconductor layer 114 toward substrate 101. Hole current Ih_S promotes recombination with electrons trapped in buffer layer 102, GaN channel layer 103, and AlGaN barrier layer 104, so that constriction of 2DEG layer 105 can be suppressed and an increase in ON resistance can be suppressed.

In Embodiment 1 of the present disclosure, as illustrated in FIG. 1B, since third semiconductor layer 114 is disposed such that it is overlapped with a part of first source electrode 112, it is possible to reduce the distance from first drain electrode 111 to first source electrode 112, so that the size of semiconductor device 10 can be reduced.

Figure 3A:
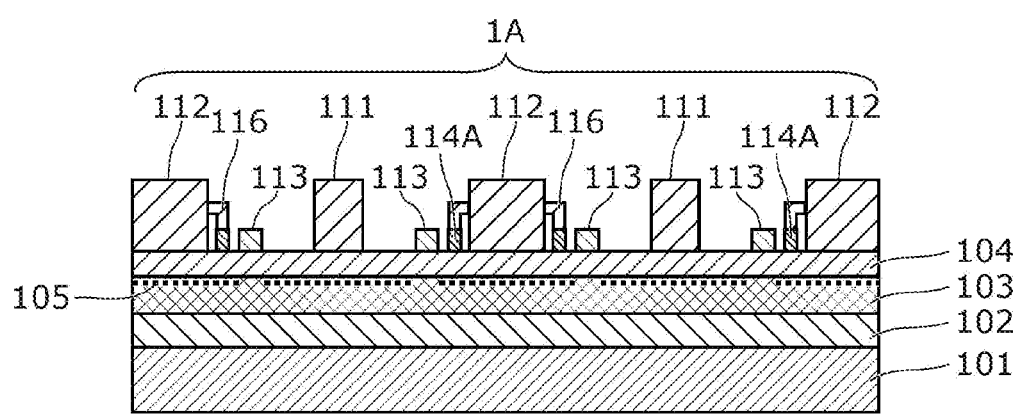
FIG. 3A is a sectional view of the semiconductor device according to Embodiment 1.

In Embodiment 1 of the present disclosure, as illustrated in FIG. 3A, third semiconductor layer 114A may be configured to be separated from first source electrode 112 in plane, and first source electrode 112 and third semiconductor layer 114A are electrically connected by source connection portion 116. Source connection portion 116 and first source electrode 112 may be made of different materials from each other. For example, a material that has a better ohmic property with third semiconductor layer 114A than first source electrode 112, for example, a metal material including palladium (Pd) may be used for source connection portion 116 such that hole current Ih_S from third semiconductor layer 114A to substrate 101 can be increased to suppress an increase in the ON resistance.

Figure 3B:
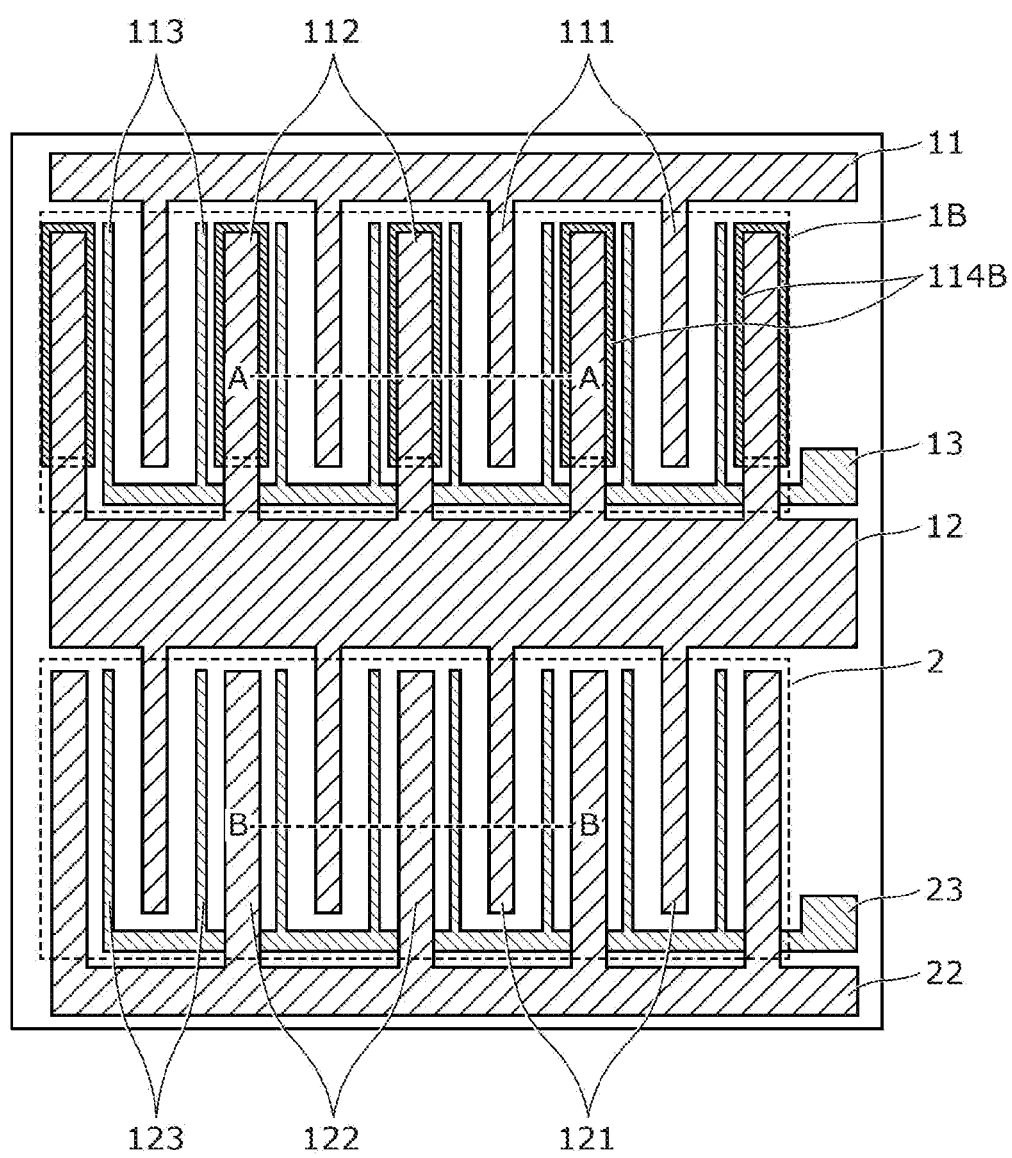
FIG. 3B is a plan view of the semiconductor device according to Embodiment 1.

In Embodiment 1 of the present disclosure, as illustrated in a plan view of FIG. 3B, third semiconductor layer 114B may have a structure surrounding first source electrode 112. With such a structure, it is possible to suppress an increase in the ON resistance in a whole area of first source electrode 112.

Figure 3C:
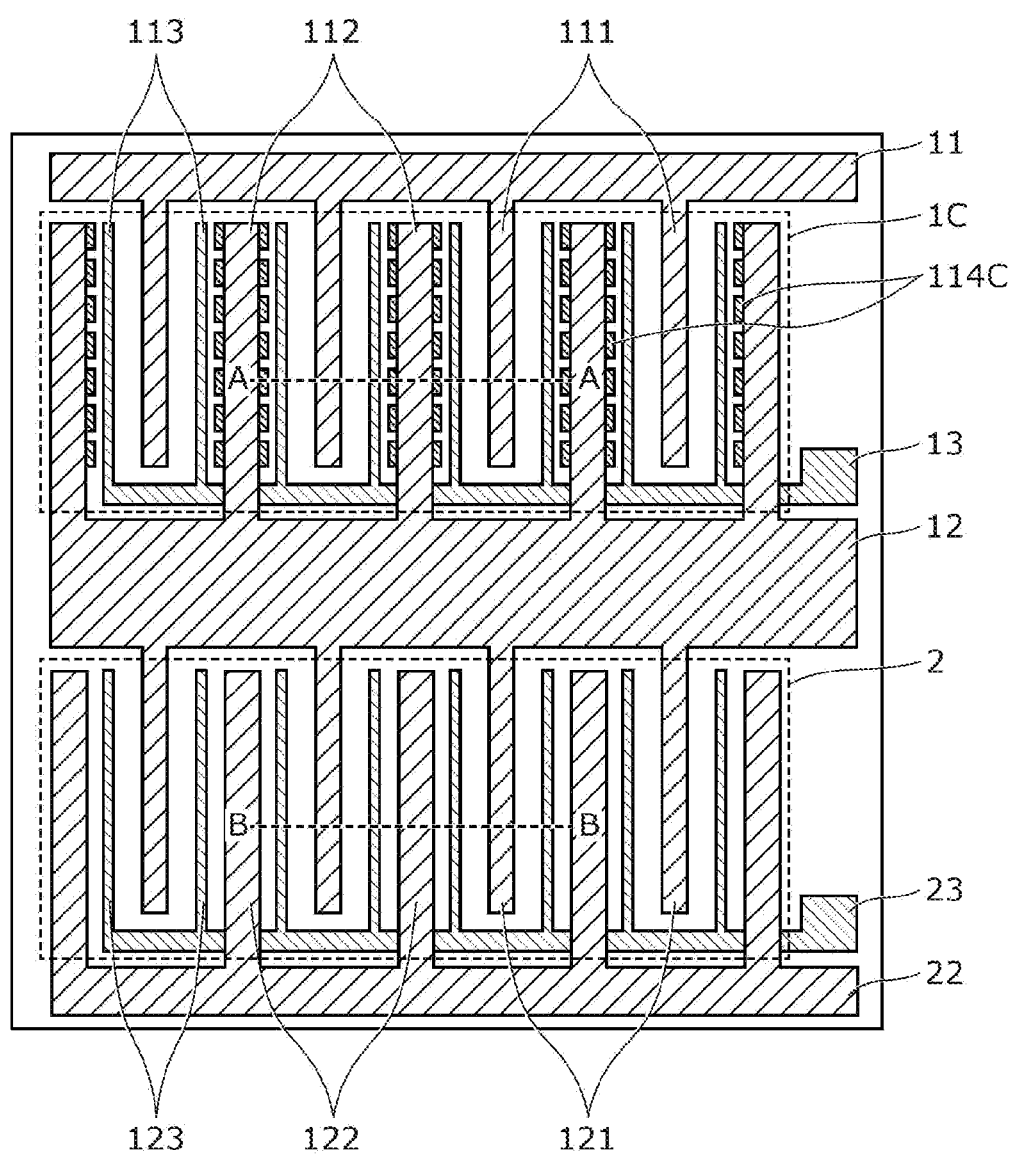
FIG. 3C is a plan view of the semiconductor device according to Embodiment 1.

In Embodiment 1 of the present disclosure, as illustrated in FIG. 3C, third semiconductor layer 114C may be disposed in an island form along first source electrode 112.

Variation 1 of Embodiment 1

Figure 4A:
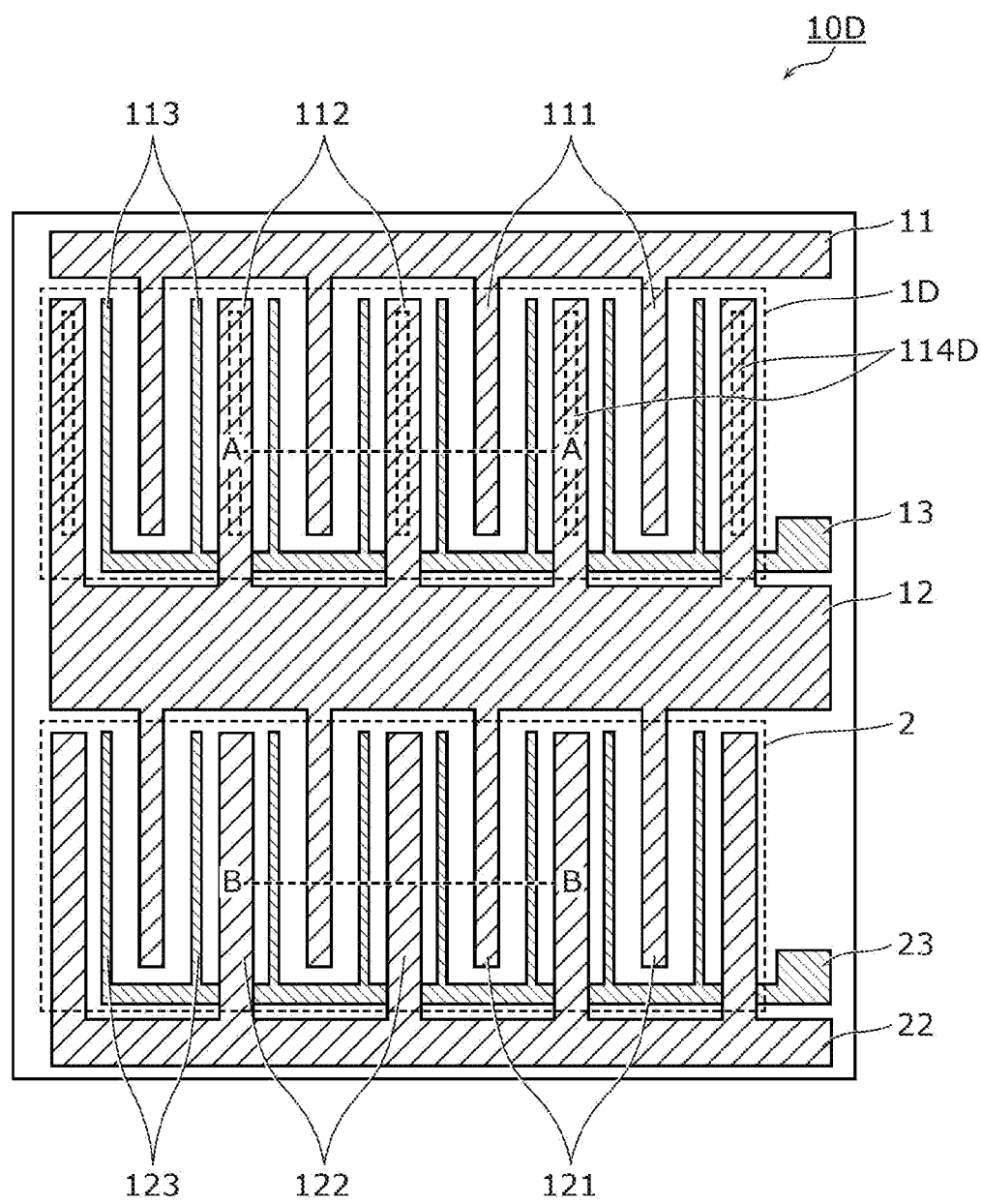
FIG. 4A is a plan view of a semiconductor device according to Variation 1 of Embodiment 1.
Figure 4B:
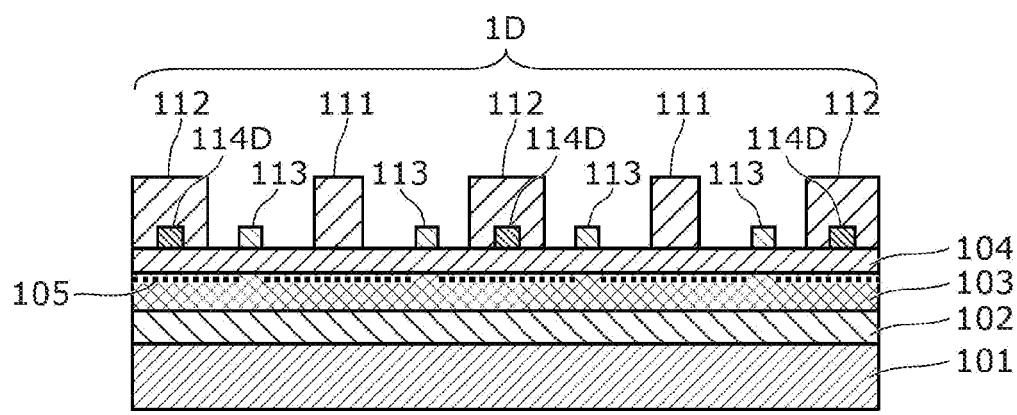
FIG. 4B is a sectional view along a line A-A according to Variation 1 of Embodiment 1.

Variation 1 of Embodiment 1 of the present disclosure will now be described. FIG. 4A illustrates a plan view of semiconductor device 10D according to Variation 1 of Embodiment 1 of the present disclosure. FIG. 4B illustrates a sectional view along a line A-A of FIG. 4A. In Variation 1 of Embodiment 1, a contact portion of first source electrode 112 and AlGaN barrier layer 104 is disposed between third semiconductor layer 114D and first gate electrode 113. By adopting such a configuration, it is possible to make the distance from first drain electrode 111 to first source electrode 112 shorter than that in FIG. 1A of Embodiment 1. With such a configuration, a hole current flows from third semiconductor layer 114D toward substrate 101 as described in Embodiment 1 and it is also possible to suppress an increase in ON resistance.

Figure 4C:
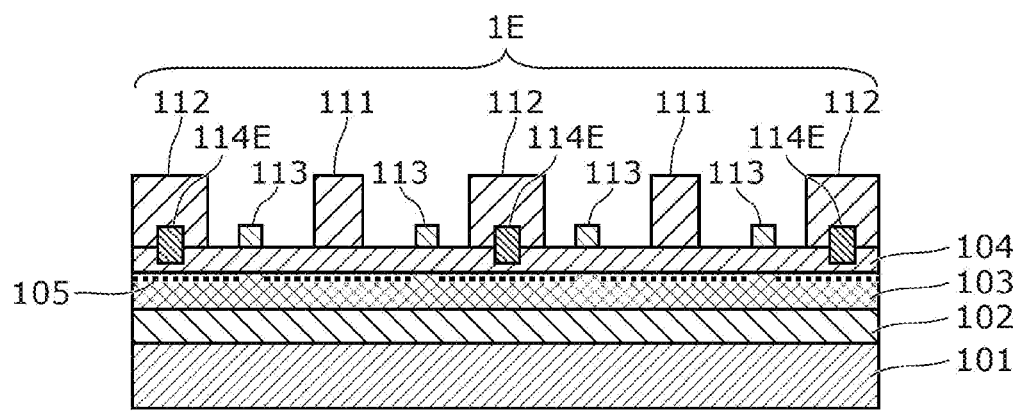
FIG. 4C is another example of a sectional view along the line A-A according to Variation 1 of Embodiment 1.

In Variation 1 of Embodiment 1 of the present disclosure, as illustrated in FIG. 4C, the thickness of AlGaN barrier layer 104 under third semiconductor layer 114E may be less than the thickness of AlGaN barrier layer 104 in other regions. Such thin AlGaN barrier layer 104 under third semiconductor layer 114E allows hole current Ih_S injected from third semiconductor layer 114E to be increased, which promotes recombination with electrons trapped in buffer layer 102, GaN channel layer 103, and AlGaN barrier layer 104 effectively, and therefore it is possible to further suppress an increase in the ON resistance. The thin AlGaN barrier layer under third semiconductor layer 114E is likely to induce depletion of 2DEG layer 105, which will however not affect a 2DEG channel between first drain electrode 111 and first source electrode 112, and therefore the ON resistance will not increase.

Figure 4D:
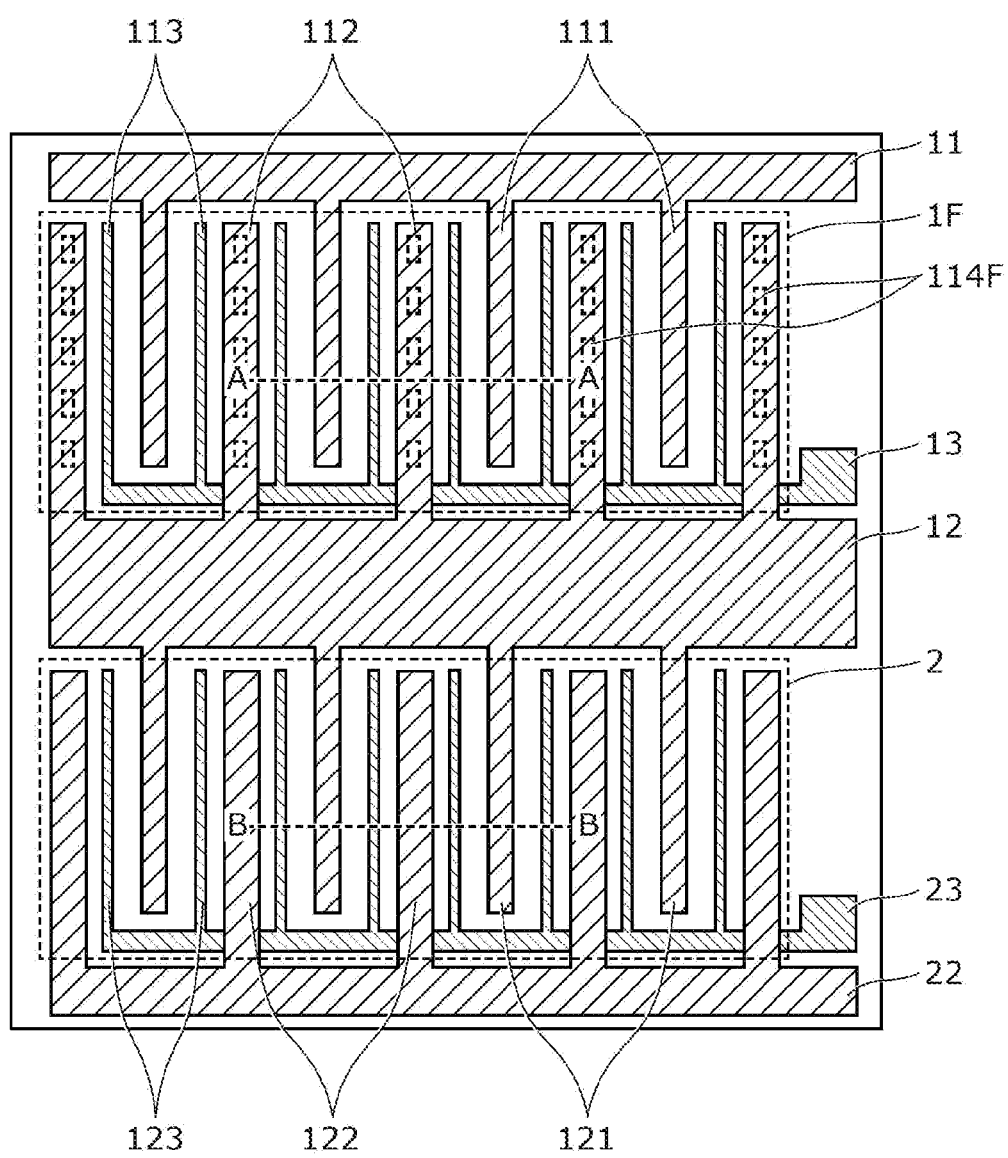
FIG. 4D is a plan view of another configuration of the semiconductor device according to Variation 1 of Embodiment 1.

In Variation 1 of Embodiment 1 of the present disclosure, as illustrated in FIG. 4D, third semiconductor layer 114F may be disposed in an island form.

Variation 2 of Embodiment 1

Figure 5A:
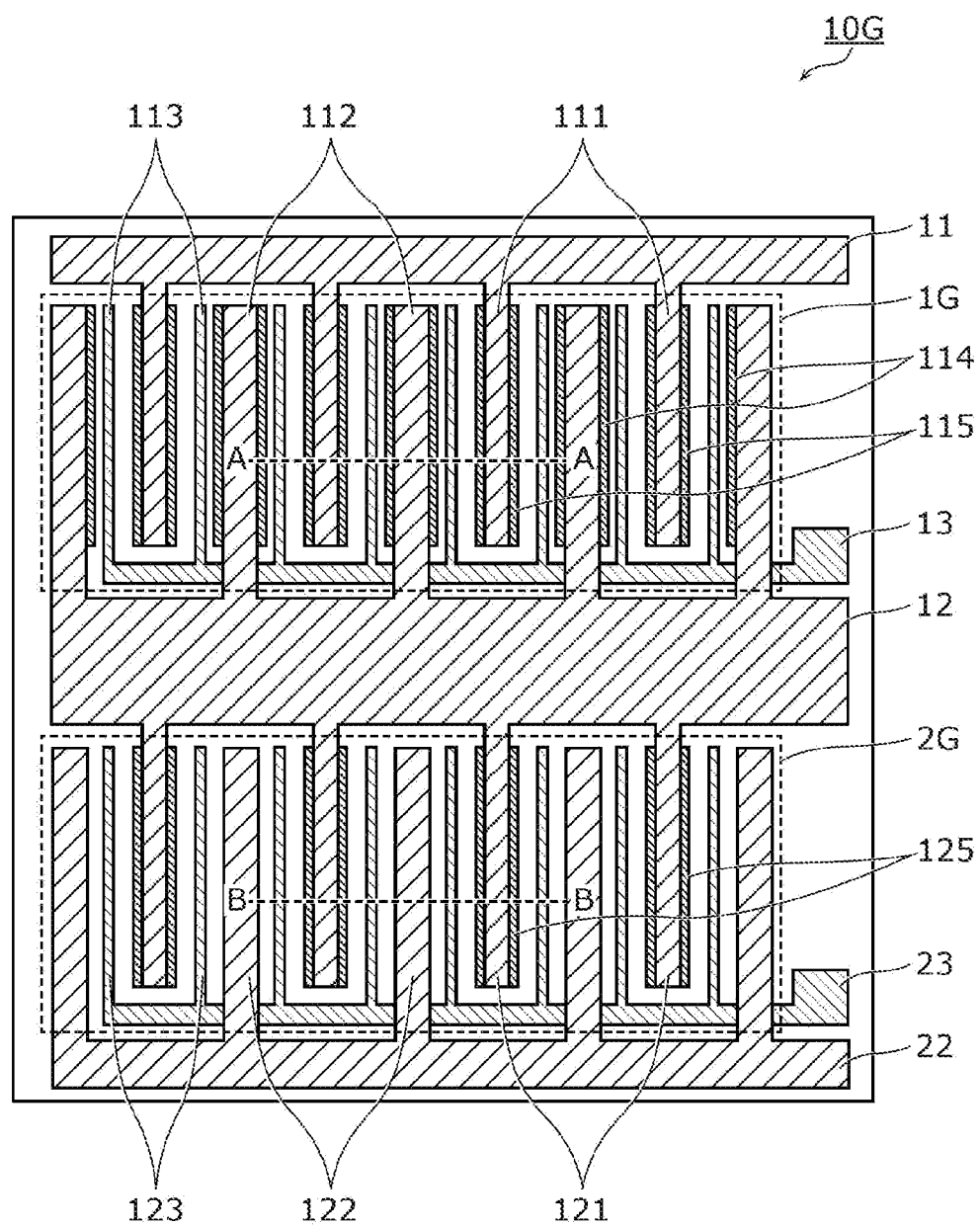
FIG. 5A is a plan view of a semiconductor device according to Variation 2 of Embodiment 1.
Figure 5B:
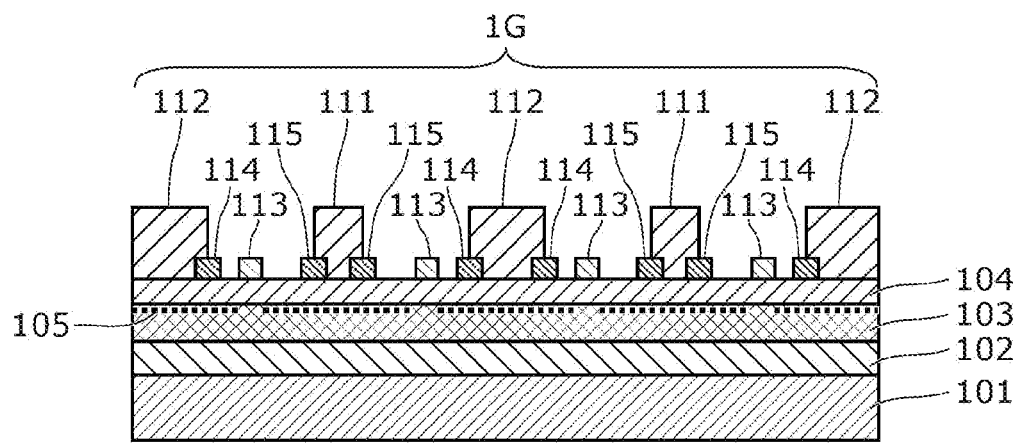
FIG. 5B is a sectional view along a line A-A according to Variation 2 of Embodiment 1.
Figure 5C:
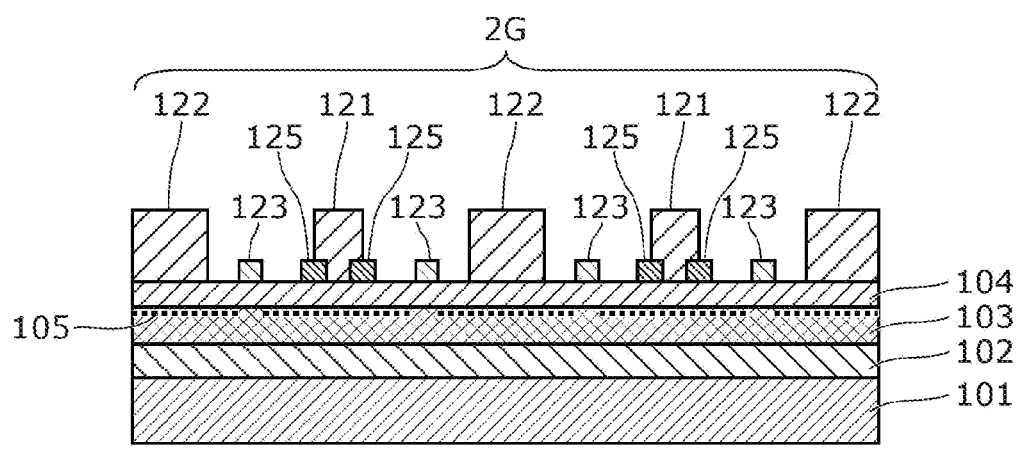
FIG. 5C is a sectional view along a line B-B according to Variation 2 of Embodiment 1.

Variation 2 of Embodiment 1 of the present disclosure will now be described. FIG. 5A illustrates a plan view of semiconductor device 10G according to Variation 2 of Embodiment 1 of the present disclosure. FIG. 5B illustrates a sectional view along a line A-A of FIG. 5A and FIG. 5C illustrates a sectional view along a line B-B of FIG. 5A.

In Variation 2 of Embodiment 1, fourth semiconductor layer 115 connected to first drain electrode 111 of first FET 1 is disposed and fifth semiconductor layer 125 connected to second drain electrode 121 of second FET 2 is disposed. Preferably, fourth semiconductor layer 115 and fifth semiconductor layer 125 are formed of, for example, GaN and are P-type semiconductors.

Figure 5D:
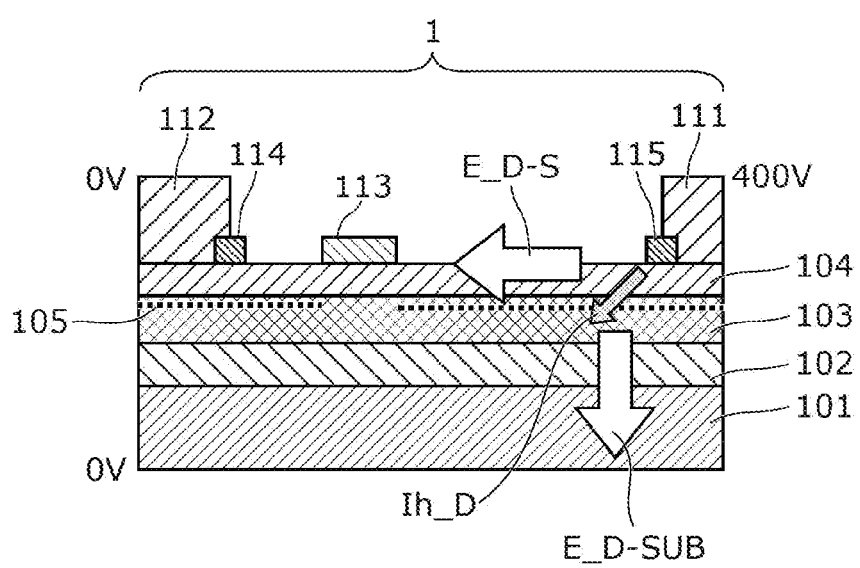
FIG. 5D is a diagram illustrating an operation of a FET in an OFF state according to Variation 2 of Embodiment 1.

FIG. 5D illustrates the operation of first FET 1G when first FET 1G is in an OFF state. Since first FET 1G is in an OFF state, drain-source voltage Vds_H of first FET 1G is about 400 V. Consequently, downward electric field E_D-SUB is applied between first drain electrode 111 and substrate 101 and lateral electric field E_D-S is applied between first drain electrode 111 and first gate electrode 113. Electric field E_D-SUB and electric field E_D-S cause electrons to be trapped in buffer layer 102, GaN channel layer 103, and AlGaN barrier layer 104 near first drain electrode 111.

In the semiconductor device according to Variation 2 of Embodiment 1 of the present disclosure, fourth semiconductor layer 115 of a P-type semiconductor is disposed on a surface of AlGaN barrier layer 104, and when first FET is in an OFF state, first drain electrode 111 is at 400 V, which is equal to a supply voltage, first source electrode 112 and first gate electrode 113 are at about 0 V, and substrate 101 is at 0 V. At this time, hole current Ih_D flows from fourth semiconductor layer 115 toward the substrate and first gate electrode 113. Hole current Ih_D promotes recombination with electrons trapped in buffer layer 102, GaN channel layer 103, and AlGaN barrier layer 104, so that constriction of 2DEG layer 105 can be suppressed and an increase in ON resistance can be suppressed. Although not illustrated, with regard to fifth semiconductor layer 125 provided on second FET 2, constriction of 2DEG layer 105 can be suppressed and an increase in ON resistance can be suppressed in a similar mechanism.

In Variation 2 of Embodiment 1 of the present disclosure, as illustrated in FIG. 5A, fourth semiconductor layer 115 is separated from first gate electrode 113, and fourth semiconductor layer 115 and first drain electrode 111 are electrically connected.

In Variation 2 of Embodiment 1 of the present disclosure, as illustrated in FIG. 5A, fifth semiconductor layer 125 is separated from second gate electrode 123, and fifth semiconductor layer 125 and second drain electrode 121 are electrically connected.

Embodiment 2

Figure 6A:
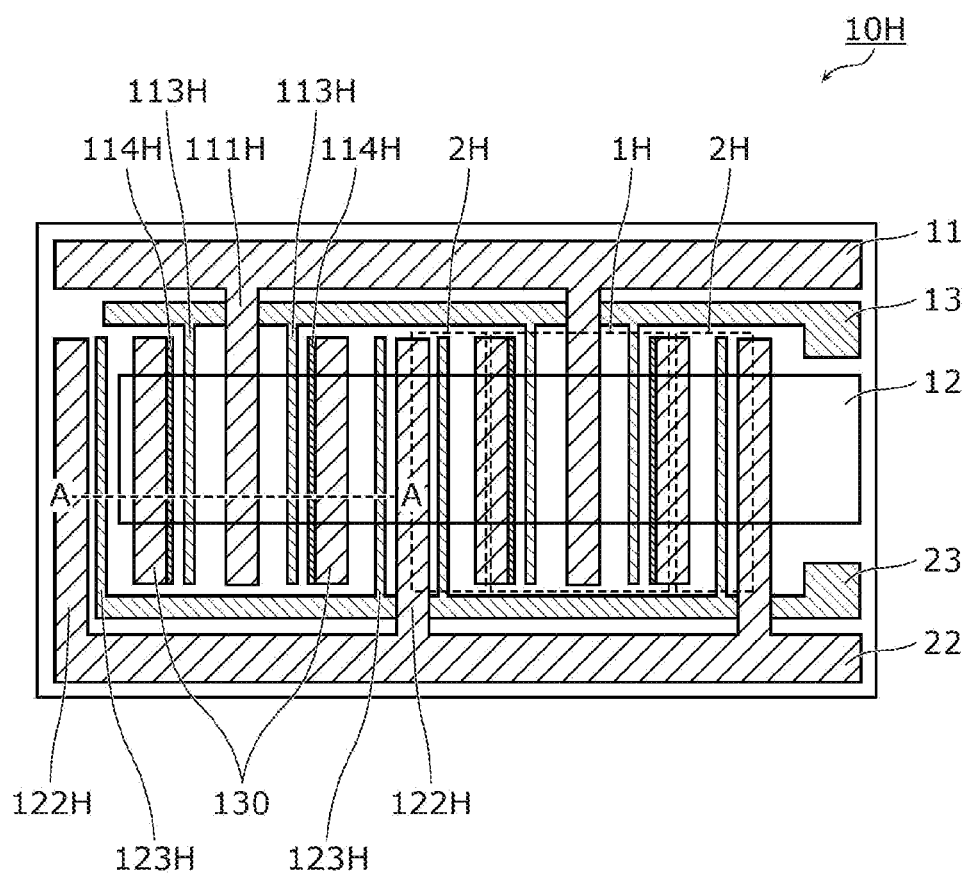
FIG. 6A is a plan view of a semiconductor device according to Embodiment 2.
Figure 6B:
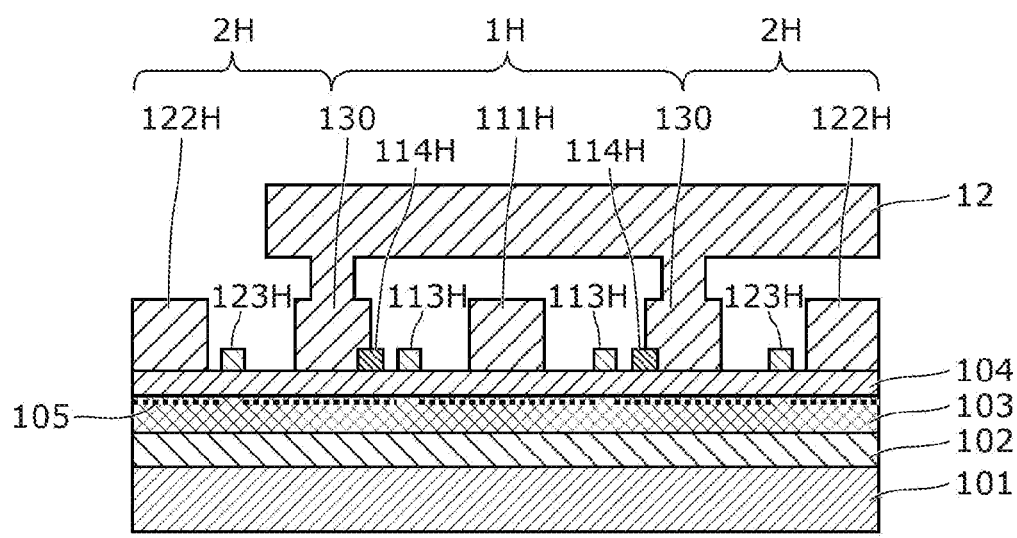
FIG. 6B is a sectional view along a line A-A according to Embodiment 2.

Embodiment 2 of the present disclosure will now be described. FIG. 6A illustrates a plan view of semiconductor device 10H according to Embodiment 2. FIG. 6B illustrates an A-A section of FIG. 6A. Those components similar to Embodiment 1, that is, components that are given reference signs with the same numerals in part except alphabets have already been discussed and the description will not be repeated.

In Embodiment 2, a first source electrode of first FET 1H and a second drain electrode of second FET 2H are shared as common electrode 130. Intermediate aggregated line 12 is connected to common electrode 130.

In Embodiment 2 of the present disclosure, since common electrode 130 serves for both the first source electrode of first FET 1H and the second drain electrode of second FET 2H, it is possible to reduce a chip area compared to the case in which there are first source electrode 112 and second drain electrode 121 separately as illustrated in FIG. 1A of Embodiment 1.

Variation of Embodiment 2

Figure 6C:
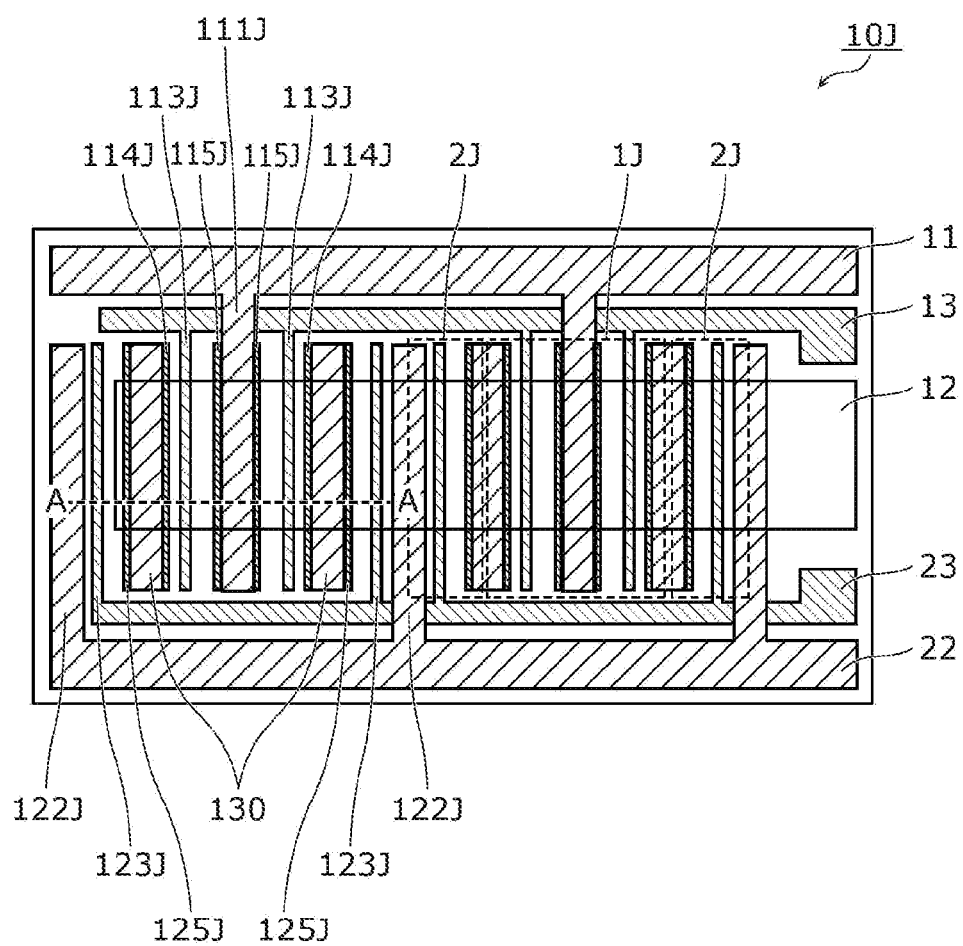
FIG. 6C is a plan view of a semiconductor device according to a variation of Embodiment 2.

In Embodiment 2, as illustrated in FIG. 6C, fourth semiconductor layer 115J connected to first drain electrode 1111 of first FET 1J and fifth semiconductor layer 125J connected to common electrode 130, which serves as the second drain electrode of second FET 2J, may be disposed. As illustrated in Variation 2 of Embodiment 1, fourth semiconductor layer 115J and fifth semiconductor layer 125J allow hole current Ih_D to flow when the FET is in an OFF state, promoting recombination with electrons trapped in buffer layer 102, GaN channel layer 103, and AlGaN barrier layer 104, so that constriction of 2DEG layer 105 can be suppressed and an increase in ON resistance can be suppressed. Third semiconductor layer 114J and fifth semiconductor layer 125J may be configured to be in contact with each other at longitudinally opposite ends of common electrode 130.

Embodiment 3

Figure 7A:
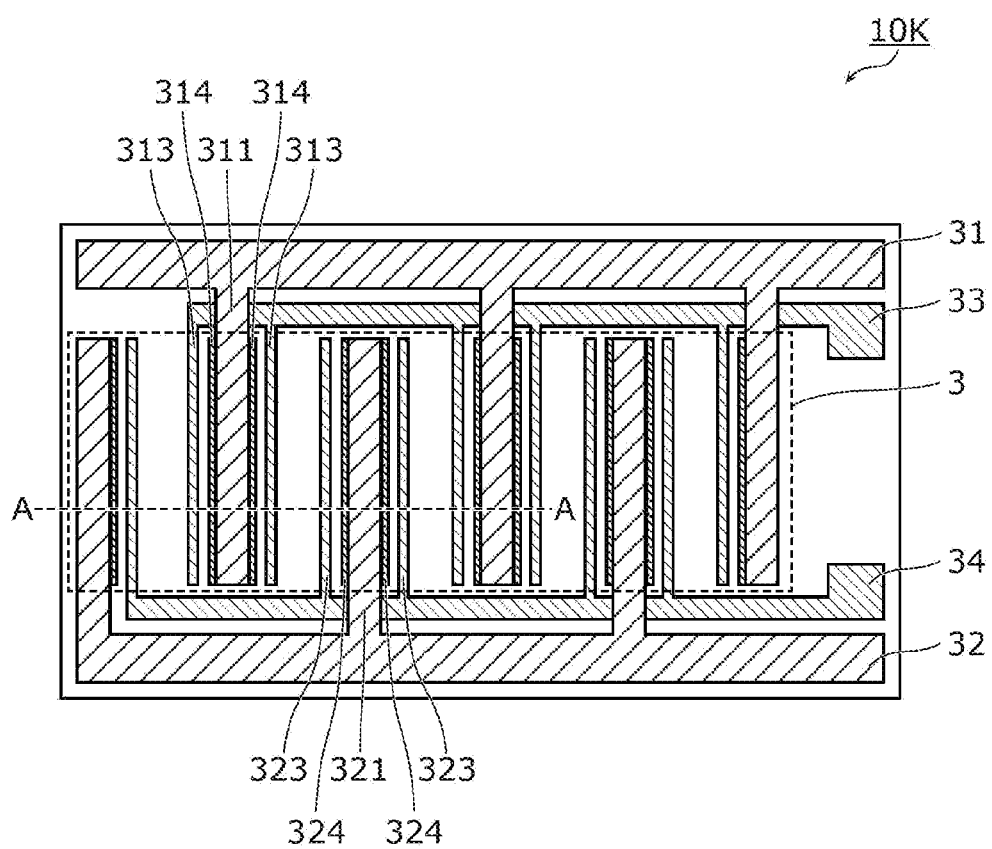
FIG. 7A is a plan view of a semiconductor device according to Embodiment 3.
Figure 7B:
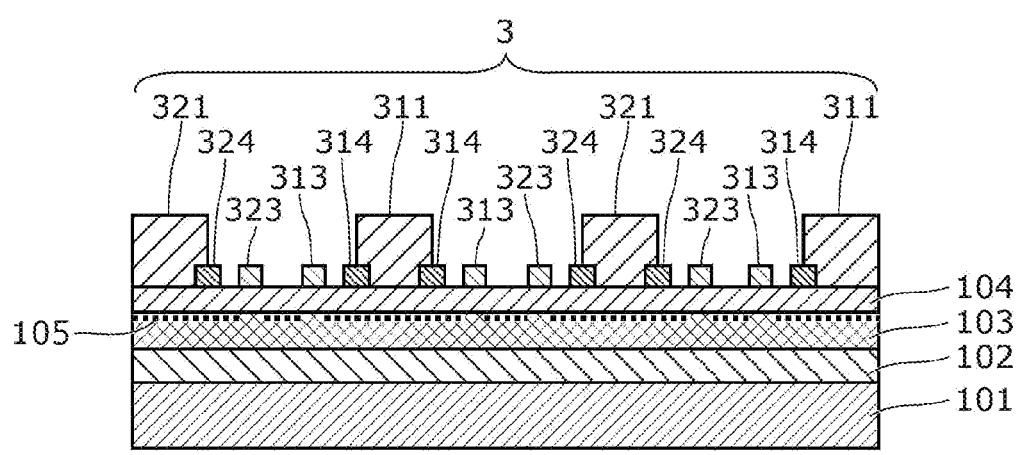
FIG. 7B is a sectional view along a line A-A according to Embodiment 3.

Embodiment 3 of the present disclosure will now be described. FIG. 7A illustrates a plan view of semiconductor device 10K according to Embodiment 3, which includes bidirectional FET 3 (bidirectional field-effect transistor 3). FIG. 7B illustrates an A-A section of FIG. 7A.

First source electrode 311, second source electrode 321, first gate electrode 313, and second gate electrode 323 that constitute bidirectional FET 3 are disposed above AlGaN barrier layer 104. Each first source electrode 311 is connected to first source aggregated line 31. Each second source electrode 321 is connected to second source aggregated line 32. There are disposed first gate electrode 313 near first source electrode 311 and second gate electrode 323 near second source electrode 321 between first source electrode 311 and second source electrode 321.

Further, as illustrated in FIG. 7B, third semiconductor layer 314 is disposed above AlGaN barrier layer 104 between a lower part of first source electrode 311 and first gate electrode 313, third semiconductor layer 314 being separated from first gate electrode 313. Third semiconductor layer 314 is disposed in electrical contact with first source electrode 311 and embedded in a part of first source electrode 311. Fourth semiconductor layer 324 is disposed above AlGaN barrier layer 104 between a lower part of second source electrode 321 and second gate electrode 323, fourth semiconductor layer 324 being separated from second gate electrode 323. Fourth semiconductor layer 324 is disposed in electrical contact with second source electrode 321 and embedded in a part of second source electrode 321.

Blockage and conduction operation of bidirectional FET 3 according to Embodiment 3 will now be described. When a voltage corresponding to a voltage of first gate electrode 313 that is less than or equal to a threshold voltage relative to first source electrode 311 is applied to first gate electrode 313 while the voltage of second source electrode 321 is higher than that of first source electrode 311, 2DEG layer 105 under first gate electrode 313 is depleted, and a blocked state in which no current flows from second source electrode 321 to first source electrode 311 is entered. On the other hand, when a voltage corresponding to a voltage of first gate electrode 313 that is greater than or equal to a threshold voltage relative to first source electrode 311 is applied to first gate electrode 313, 2DEG layer 105 under first gate electrode 313 is placed in a conduction state, and a current flows from second source electrode 321 to first source electrode 311. Similarly, When a voltage corresponding to a voltage of second gate electrode 323 that is less than or equal to a threshold voltage relative to second source electrode 321 is applied to second gate electrode 323 while the voltage of first source electrode 311 is higher than that of second source electrode 321, 2DEG layer 105 under second gate electrode 323 is depleted, and a blocked state in which no current flows from first source electrode 311 to second source electrode 321 is entered. On the other hand, when a voltage corresponding to a voltage of second gate electrode 323 that is greater than or equal to a threshold voltage relative to second source electrode 321 is applied to second gate electrode 323, 2DEG layer 105 under second gate electrode 323 is placed in a conduction state, and a current flows from first source electrode 311 to second source electrode 321. In this way, by controlling first gate electrode 313 and second gate electrode 323 with respect to first source electrode 311 and second source electrode 321, respectively, it is possible to control blockage and conduction of a bidirectional current between first source electrode 311 and second source electrode 321.

Figure 8A:
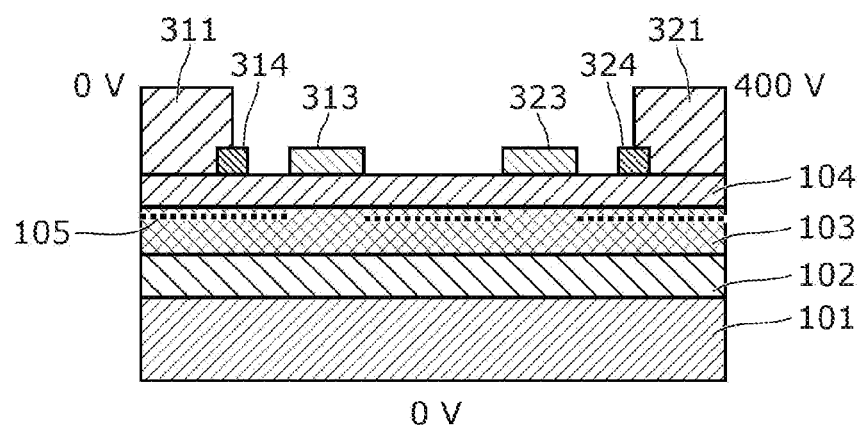
FIG. 8A is a diagram illustrating an operation of a bidirectional FET in an OFF state according to Embodiment 3.

The operation of bidirectional FET 3 during switching will now be described. FIG. 8A illustrates the operation of the transistor when bidirectional FET 3 is in an OFF state and the voltage of second source electrode 321 is higher than that of first source electrode 311. When first source electrode 311 is at 0 V, which is equal to a reference voltage, the voltage of second source electrode 321 is, for example, about 400 V. The voltage of substrate 101 is, for example, 0 V. In a bidirectional FET, since the relative magnitude of voltage between first source electrode 311 and second source electrode 321 varies depending on the operation of the system, it is a common practice to allow the potential of substrate 101 to float instead of being directly connected to first source electrode 311 and second source electrode 321.

Figure 8B:
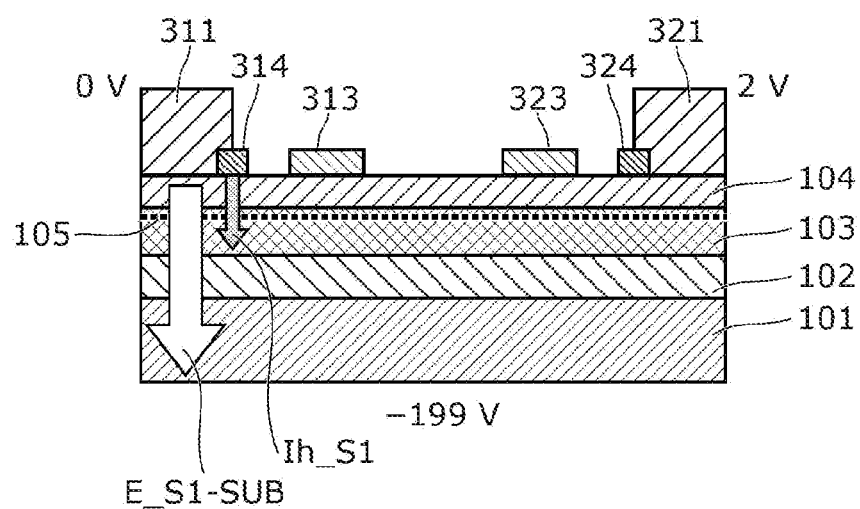
FIG. 8B is a diagram illustrating an operation of the bidirectional FET in an ON state according to Embodiment 3.

Here, behavior of bidirectional FET 3 when it is switched from an OFF state to an ON state will be described. FIG. 8B illustrates the operation of bidirectional FET 3 immediately after it is switched from an OFF state to an ON state. Assuming that the voltage of first source electrode 311 is 0 V, which is equal to the reference voltage, the voltage of second source electrode 321 decreases from 400 V down to about 2 V. The voltage of substrate 101 immediately after bidirectional FET 3 is switched to an ON state is determined by a ratio of a capacity from second source electrode 321 to substrate 101 to a capacity from first source electrode 311 to substrate 101 because substrate 101 is floated. Accordingly, when the ratio of the capacity from second source electrode 321 to substrate 101 to the capacity from first source electrode 311 to substrate 101 is 1:1, the voltage of substrate 101 is about −199 V. At this time, downward electric field E_S1-SUB is applied between first source electrode 311 and substrate 101. Electric field E_S1-SUB causes electrons to be trapped in buffer layer 102, GaN channel layer 103, and AlGaN barrier layer 104 near first source electrode 311.

In the semiconductor device according to Embodiment 3 of the present disclosure, third semiconductor layer 314 of a P-type semiconductor is disposed on a surface of AlGaN barrier layer 104, so that when bidirectional FET 3 is switched to an ON state, hole current Ih_S1 flows from third semiconductor layer 314 toward substrate 101. Hole current Ih_S1 promotes recombination with electrons trapped in buffer layer 102, GaN channel layer 103, and AlGaN barrier layer 104, so that constriction of 2DEG layer 105 can be suppressed and an increase in ON resistance can be suppressed.

Figure 8C:
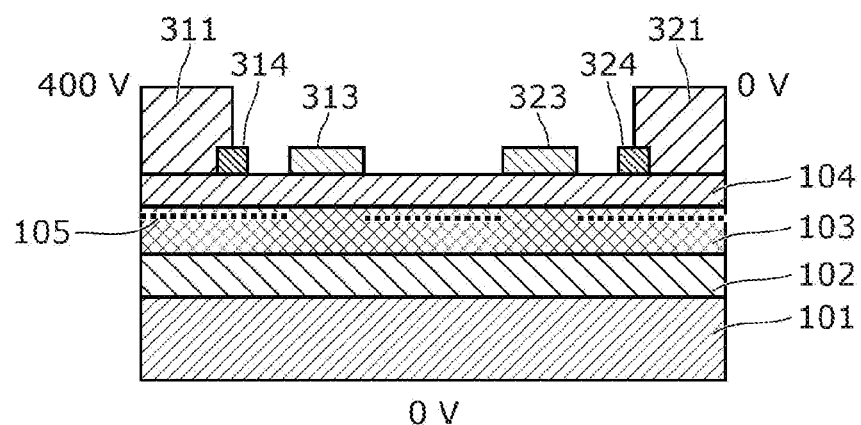
FIG. 8C is a diagram illustrating an operation of the bidirectional FET in an OFF state according to Embodiment 3.
Figure 8D:
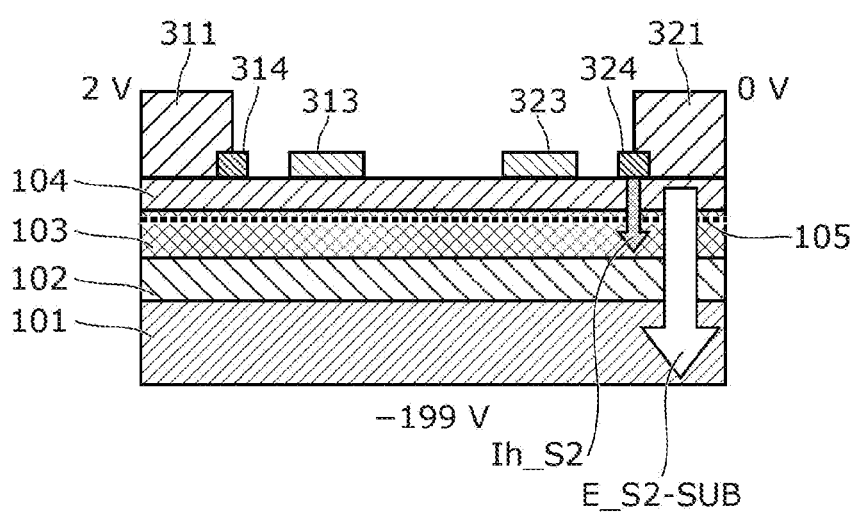
FIG. 8D is a diagram illustrating an operation of the bidirectional FET in an ON state according to Embodiment 3.
Figure 9:
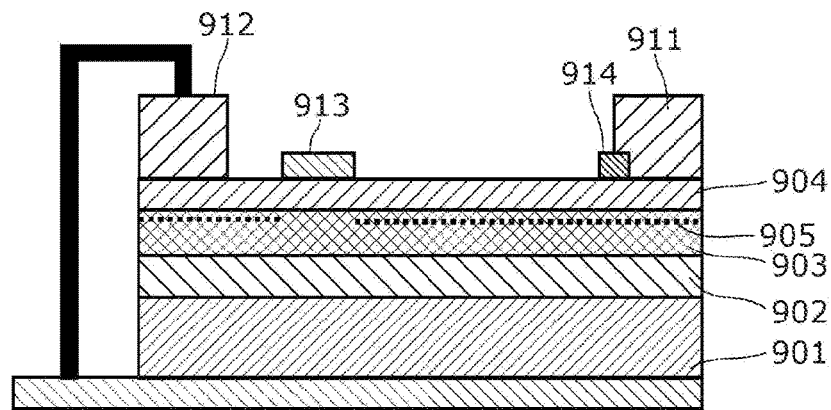
FIG. 9 is a sectional view of a semiconductor device of prior art.
Figure 10:
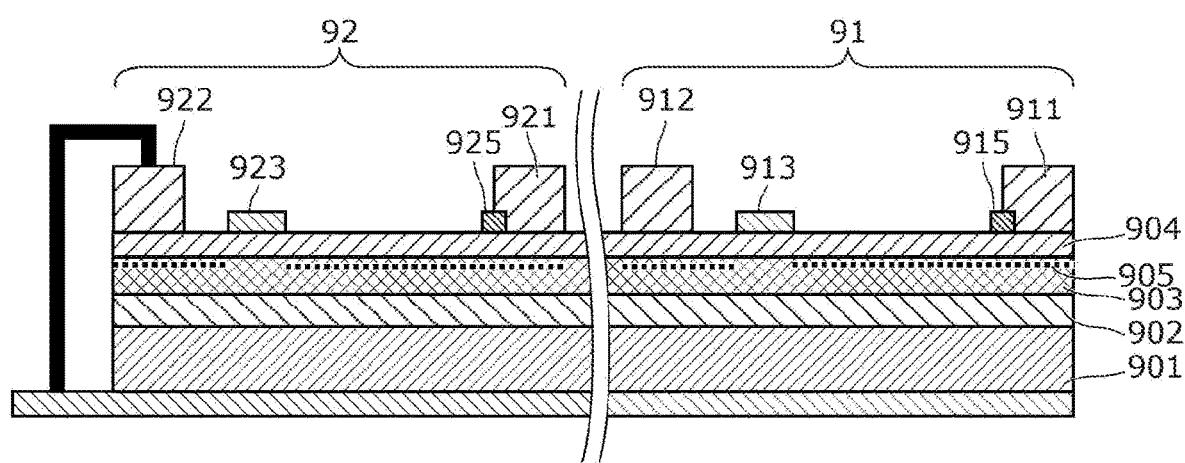
FIG. 10 is a sectional view of a half bridge formed from a semiconductor device of prior art.
Figure 11A:
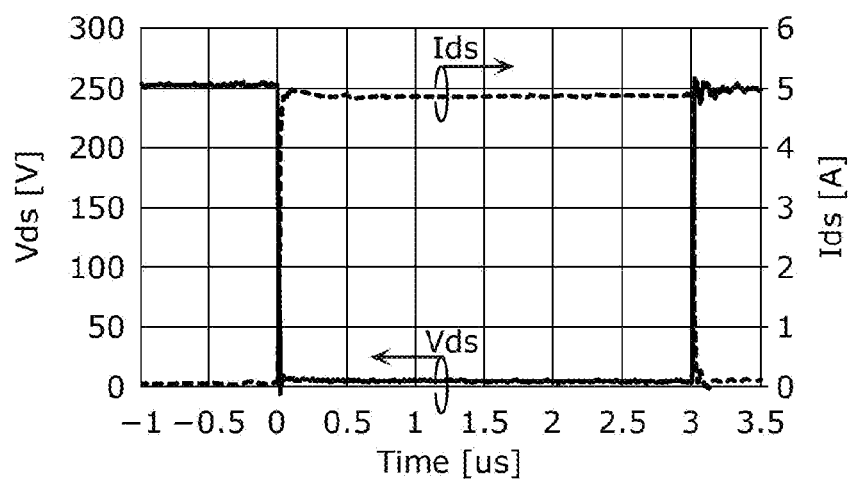
FIG. 11A illustrates low side switching waveforms of the half bridge of prior art.
Figure 11B:
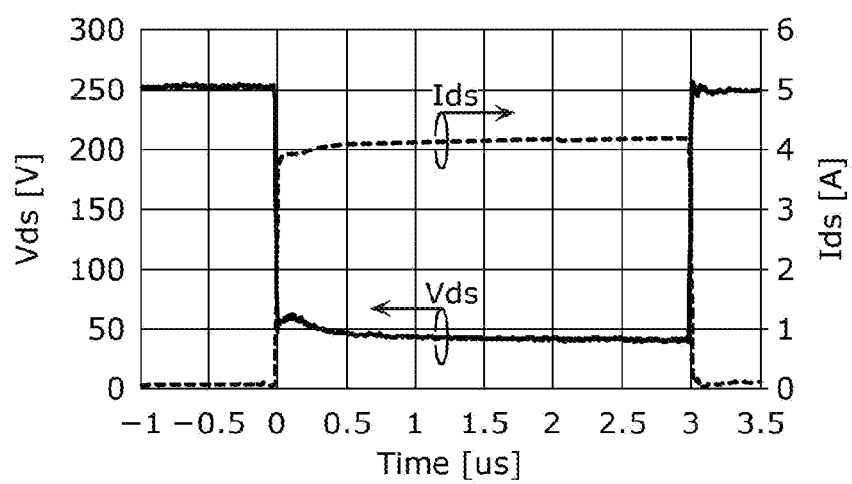
FIG. 11B illustrates high side switching waveforms of the half bridge of prior art.

A similar operation occurs when the voltage of first source electrode 311 of bidirectional FET 3 is higher than that of second source electrode 321. FIG. 8C illustrates the operation of bidirectional FET 3 when it is in an OFF state. When the voltage of second source electrode 321 is, for example, 0 V, which is equal to the reference voltage, the voltage of first source electrode 311 is, for example, about 400 V. The voltage of substrate 101 is 0 V. FIG. 8D illustrates the behavior of the bidirectional FET when it is switched from an OFF state to an ON state. Since the voltage of second source electrode 321 is 0 V, the voltage of first source electrode 311 decreases from 400 V down to about 2 V and the voltage of substrate 101 becomes about −199 V. At this time, downward electric field E_S2-SUB is generated from second source electrode 321 to substrate 101, and electrons are trapped in buffer layer 102, GaN channel layer 103, and AlGaN barrier layer 104 near second source electrode 321.

In semiconductor device 10K according to Embodiment 3 of the present disclosure, fourth semiconductor layer 324 of a P-type semiconductor is disposed on a surface of AlGaN barrier layer 104, and hole current Ih_S2 flows from fourth semiconductor layer 324 toward substrate 101 when bidirectional FET 3 is switched to an ON state. Hole current Ih_S2 promotes recombination with electrons trapped in buffer layer 102, GaN channel layer 103, and AlGaN barrier layer 104, so that constriction of 2DEG layer 105 can be suppressed and an increase in ON resistance can be suppressed.

INDUSTRIAL APPLICABILITY

The semiconductor device according to the present disclosure is applicable to a half bridge, which is a typical configuration of a switched-mode power supply. The semiconductor device is also applicable to a full bridge, which is formed by using 2 half bridges, and a 3 phase inverter, which is formed by using 3 half bridges. The semiconductor device is also applicable to an active clamp-type flyback converter.

The invention claimed is:
1. A semiconductor device comprising:
a substrate;
a first nitride semiconductor layer disposed above the substrate;
a second nitride semiconductor layer disposed above the first nitride semiconductor layer and having a band gap greater than a band gap of the first nitride semiconductor layer; and
a first field-effect transistor including a first source electrode, a first drain electrode, and a first gate electrode that are disposed above the second nitride semiconductor layer, the first source electrode and the first drain electrode being separated from each other, the first gate electrode being disposed between the first source electrode and the first drain electrode,
wherein the first field-effect transistor includes a third semiconductor layer disposed above the second nitride semiconductor layer in a part of a region between a lower part of the first source electrode and the first gate electrode, the third semiconductor layer being separated from the first gate electrode,
the third semiconductor layer and the first source electrode are electrically connected,
the third semiconductor layer is a p-type semiconductor, and in the first field-effect transistor, a part of the first source electrode is located between the third semiconductor layer and the first gate electrode in a cross-sectional view.

2. The semiconductor device according to claim 1, wherein at least a part of the third semiconductor layer is disposed between the first gate electrode and a contact portion of the first source electrode and the second nitride semiconductor layer.

3. The semiconductor device according to claim 2, wherein, in plan view, the third semiconductor layer is disposed to surround the first source electrode.

4. The semiconductor device according to claim 1, wherein a thickness of the second nitride semiconductor layer immediately below the third semiconductor layer is less than a thickness of the second nitride semiconductor layer in another region.

5. The semiconductor device according to claim 1, wherein the third semiconductor layer is island-shaped.

6. The semiconductor device according to claim 1, wherein the first field-effect transistor includes a fourth semiconductor layer disposed above the second nitride semiconductor layer between the first gate electrode and the first drain electrode, the fourth semiconductor layer being disposed in proximity to the first drain electrode and separated from the first gate electrode, and the fourth semiconductor layer and the first drain electrode are electrically connected.

7. The semiconductor device according to claim 1, wherein a potential of the first source electrode and a potential of the substrate are different.

8. The semiconductor device according to claim 7, further comprising:
a second field-effect transistor including a second source electrode, a second drain electrode, and a second gate electrode that are disposed above the second nitride semiconductor layer, the second source electrode and the second drain electrode being separated from each other, the second gate electrode being disposed between the second source electrode and the second drain electrode, wherein the potential of the first source electrode and a potential of the second source electrode are different.

9. The semiconductor device according to claim 8, wherein the first source electrode and the second drain electrode are electrically connected.

10. The semiconductor device according to claim 9, wherein the second source electrode and the substrate are electrically connected.

11. The semiconductor device according to claim 9, wherein the first source electrode and the second drain electrode are configured by a common electrode.

12. The semiconductor device according to claim 11, wherein the second field-effect transistor includes a fifth semiconductor layer above the second nitride semiconductor layer between the second gate electrode and an end of the common electrode closer to the second gate electrode, the fifth semiconductor layer being separated from the second gate electrode, and the fifth semiconductor layer and the common electrode are electrically connected.

13. The semiconductor device according to claim 1, wherein the first field-effect transistor includes a part of a contact portion of the first source electrode and the second nitride semiconductor layer, between a contact portion of the third semiconductor layer and the second nitride semiconductor layer and a contact portion of the first gate electrode and the second nitride semiconductor layer.

* * * * *